(12) United States Patent
Abedifard et al.

(10) Patent No.: US 8,891,326 B1
(45) Date of Patent: Nov. 18, 2014

(54) METHOD OF SENSING DATA IN MAGNETIC RANDOM ACCESS MEMORY WITH OVERLAP OF HIGH AND LOW RESISTANCE DISTRIBUTIONS

(71) Applicant: Avalanche Technology, Inc., Fremont, CA (US)

(72) Inventors: Ebrahim Abedifard, San Jose, CA (US); Mahmood Mozaffari, Los Gatos, CA (US); Petro Estakhri, Danville, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/024,580

(22) Filed: Sep. 11, 2013

(51) Int. Cl.
G11C 7/02       (2006.01)
G11C 11/16      (2006.01)

(52) U.S. Cl.
CPC ........ G11C 11/1673 (2013.01); G11C 11/1675 (2013.01); G11C 11/1677 (2013.01); *G11C 11/16* (2013.01)
USPC ... 365/210.1; 365/158; 365/207; 365/189.05; 365/189.07; 365/189.15

(58) Field of Classification Search
CPC ............... G11C 11/16; G11C 11/1673; G11C 11/1675; G11C 11/1677
USPC ........... 365/210.1, 158, 207, 189.07, 189.05, 365/189.15
See application file for complete search history.

(56) References Cited

U.S. PATENT DOCUMENTS

| | | | | |
|---|---|---|---|---|
| 6,650,562 B2 * | 11/2003 | Holden et al. | ............... | 365/97 |
| 6,807,088 B2 * | 10/2004 | Tsuchida | ............... | 365/158 |
| 6,940,744 B2 * | 9/2005 | Rinerson et al. | ............... | 365/148 |
| 7,321,507 B2 * | 1/2008 | Yang et al. | ............... | 365/158 |
| 7,372,753 B1 * | 5/2008 | Rinerson et al. | ............... | 365/209 |
| 7,453,740 B2 * | 11/2008 | DeBrosse et al. | ........ | 365/189.07 |
| 7,596,045 B2 * | 9/2009 | DeBrosse et al. | ............... | 365/209 |
| 7,728,622 B2 * | 6/2010 | Chua-Eoan et al. | ............... | 326/40 |
| 8,040,154 B2 * | 10/2011 | Chua-Eoan et al. | ............... | 326/40 |
| 8,059,480 B2 * | 11/2011 | Lee et al. | ............... | 365/209 |
| 8,164,961 B2 * | 4/2012 | Honma | ............... | 365/189.15 |
| 8,194,439 B2 * | 6/2012 | Kim et al. | ............... | 365/158 |
| 8,295,082 B2 * | 10/2012 | Chua-Eoan et al. | ............... | 365/171 |
| 8,320,166 B2 * | 11/2012 | Park et al. | ............... | 365/158 |
| 8,441,881 B1 * | 5/2013 | Nemati | ............... | 365/227 |
| 8,446,753 B2 * | 5/2013 | Kim et al. | ............... | 365/148 |
| 8,509,003 B2 * | 8/2013 | Lin et al. | ............... | 365/185.21 |
| 8,644,060 B2 * | 2/2014 | Abedifard et al. | ............... | 365/158 |
| 8,654,595 B2 * | 2/2014 | Kim et al. | ............... | 365/189.15 |

* cited by examiner

*Primary Examiner* — Viet Q Nguyen
(74) *Attorney, Agent, or Firm* — Maryam Imam; IPxLAW Group LLP

(57) ABSTRACT

A method of writing to a magneto tunnel junction (MTJ) includes writing data to the MTJ, reading the written data using a first reference MTJ and reading the written data using a second reference MTJ. Based on the reading steps and the result of the comparing step, setting a select bit to select the proper reference for future reads.

14 Claims, 7 Drawing Sheets

| Select bit read with Rhr reference | Select bit read with Rlr reference | The correct set of the data |
|---|---|---|
| 1 | 0 | Date is correct with either Ref. |
| 1 | 1 | Date is correct with Rhr as Ref. |
| 0 | 1 | Data can not be retrieved (read error) |
| 0 | 0 | Date is correct with Rlr as Ref. |

Table 1

FIG. 8

METHOD OF SENSING DATA IN MAGNETIC RANDOM ACCESS MEMORY WITH OVERLAP OF HIGH AND LOW RESISTANCE DISTRIBUTIONS

BACKGROUND OF THE INVENTION

1. Field of the Invention

The invention relates generally to magnetic random access memories (MRAMs), with magneto tunnel junctions (MTJs) and, more particularly, to a method and apparatus for reading from and writing to the MRAMs.

2. Description of the Prior Art

Magnetic random access memory (MRAM) is a type of non-volatile memory in which magnetization of magnetic layers in MTJs switches between parallel (corresponding to a low resistance state) and anti-parallel (corresponding to a high resistance state). An MRAM typically includes a magneto tunnel junction (MTJ), the resistance of which defines the logical state the MRAM cell.

An MTJ is considered to have a logical state of zero or one depending on the resistance value across the MTJ. In particular, the magnetic direction of the free layer of the MTJ is parallel or anti-parallel relative to a fixed or reference layer when data is being saved into or read from the MTJ. When the free layer has a magnetization that is parallel to that of the fixed layer, the resistance of the MTJ is less than when the magnetization of the free layer is anti-parallel relative to that of the fixed layer.

Therefore, the data stored in an MTJ is considered to be logical state '0' when the resistance of the MTJ is low and the MTJ is considered to be logical state '1' when the resistance of the MTJ is high. It is noted that the logical states may be reversed in some designs where lower resistance is considered to be logical state '1' and higher resistance is considered to be logical state '0'.

The resistance of a MTJ is inversely proportional to the area of the MTJ. Thus, in a large memory array that is made of MTJs or MRAMs, the MTJ resistance varies across the die on which the MTJ is formed follows a Gaussian distribution. In a large memory array, the low resistance (R) values of the MTJs generally have an average resistance value represented by "Rlavg" with variations specified by the notation "Srl". In the same memory array, the programmed MTJs have a higher average resistance value represented by "Rhavg", and also higher variations specified by the notation "Srh". To read the MTJs, typically data is extracted by comparing the resistance value of the MTJ to the resistance value of a reference MTJ that has a resistance value defined by the following equation:

$$Rref = (Rl3sig + Rh3sig)/2 \qquad (1)$$

Where Rl3sig is the resistance value of the Rlow, 3 sigma higher than the Rlavg and Rh3sig is the resistance value of the Rhigh 3 sigma lower than the Rhavg. These are shown in FIG. 1 as Rlr and Rhr and Rref. The choice of 3 sigma is optional, one can use 5 sigma or higher.

FIG. 1 shows a graph 10 of the Gaussian distribution of Rlow at 12 and Rhigh at 14. The x-axis of the graph 10 represents resistance values and the y-axis thereof represents the number of resistances (or MTJs). The Rlow 12 and Rhigh 14 are shown to overlap at 16. This overlap, which is defined in the area between the Rhr 20 and the Rlr 18, causes errors when reading data. "Rhr" 20 is the lowest resistance value a high reference resistor can take on and "Rlr" 18 is the lowest resistance value a low reference resistor can take on.

The MTJs with higher resistances than Rref, are considered to have a logical state of '1' and the MTJs with lower resistance (R), that is less than Rref, are considered to have a logical state of '0'.

If the two Gaussian distributions, shown in FIG. 1, are sufficiently apart where no overlap or tolerably little overlap occurs, employing only one reference is sufficient for sensing (reading) and determining the MTJ resistance values, but the sensing becomes difficult when the Rlow and Rhigh distributions are too close and/or overlap. The latter situation clearly leads to intolerable errors in reading or sensing the MTJs.

What is therefore needed is a reliable method and apparatus for writing to and reading from MRAMs that include MTJs.

SUMMARY OF THE INVENTION

Briefly, a method of writing to a magneto tunnel junction (MTJ) is disclosed. The method includes writing data to the MTJ, reading the written data using a first reference MTJ and reading the written data using a second reference MTJ. Based on the reading steps and the result of the comparing step, setting a select bit.

In an embodiment of the invention, the select bit is indicative of which reference MTJ to use to write new data.

In an embodiment of the invention, the select bit is indicative of the stored data being corrupt.

These and other objects and advantages of the present invention will no doubt become apparent to those skilled in the art after having read the following detailed description of the various embodiments illustrated in the several figures of the drawing.

IN THE DRAWINGS

FIG. 8 shows the Table 1, which is an example of the state of two select bits, in accordance with an embodiment of the invention.

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

Figure 2:
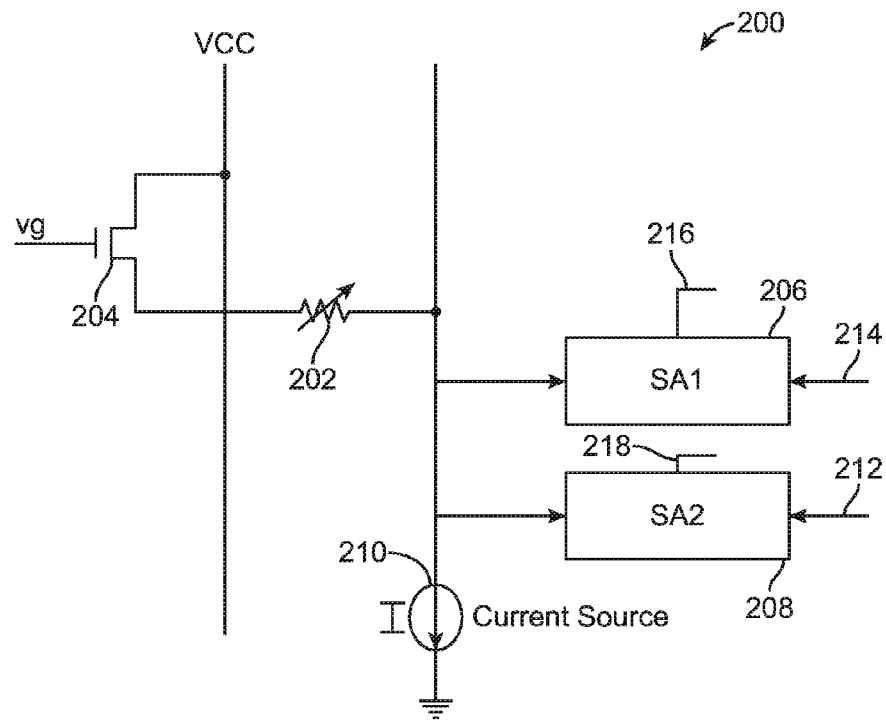
FIG. 2 shows a sensing circuit, in accordance with an embodiment of the invention.

Referring now to FIG. 2, a sensing circuit 200 is shown in accordance with an embodiment of the invention. It is understood that while not shown in the interest of clarity, the sensing circuit 200 is a part of a larger circuit or memory system that includes multiples of the components/memory shown in FIG. 2.

In FIG. 2, the sensing circuit 200 is shown to include a sense amplifier 206, a sense amplifier 208, a magneto tunnel junction (MTJ) 202, an access transistor 204, and a current source 210. The access transistor 204 and the MTJ 202 are collectively referred to herein as "memory element" and the MTJ 202 is sometimes referred to herein as "memory cell".

In an embodiment of the invention, the MTJ 202 is a part of a spin transfer torque magnetic random access memory (STT-MRAM), resistive random access memory (RRAM), or phase controlled magnetic random access memory (PCMRAM). In fact, the MTJ 202 may be a part of any type of memory that saves two states with the possibility of overlapped states. Additionally, overlapping is not limited to resistance and can rather be voltage overlap or current overlap.

The access transistor 204 is shown to have a gate that is at a voltage, Vg, during manufacturing/testing and operation of the circuit 200. The access transistor 204 is also shown to be at voltage level Vcc at its drain and coupled to the MTJ 202 at its source. "Vcc" is typically a suitably higher voltage level than 0 volts to cause sensing and/or programming of the MTJ 202. The MTJ 202 is shown coupled to the current source 210 at an end opposite to that which is shown coupled to the access transistor 204.

The current source 210 is shown coupled to the sense amplifiers 206 and 208 at one end and at another end thereof, the current source 210 is shown to be substantially at ground, or 0 volts. The sense amplifier 206 is shown to have another input, i.e. Rlr 214, the low reference resistance, which is one of the reference resistors required to read/write data. The sense amplifier 208 is shown to have another input, i.e. Rhr 212, the high reference resistance, which is another one of the reference resistors required to read/write data.

The circuit 200, alternatively, may have more than two sense amplifiers to accommodate multi-level magnetic cells. That is, each memory cell may be configured to store more than one bit of data with each bit of data read or written by using multiple resistance values.

Figure 1:
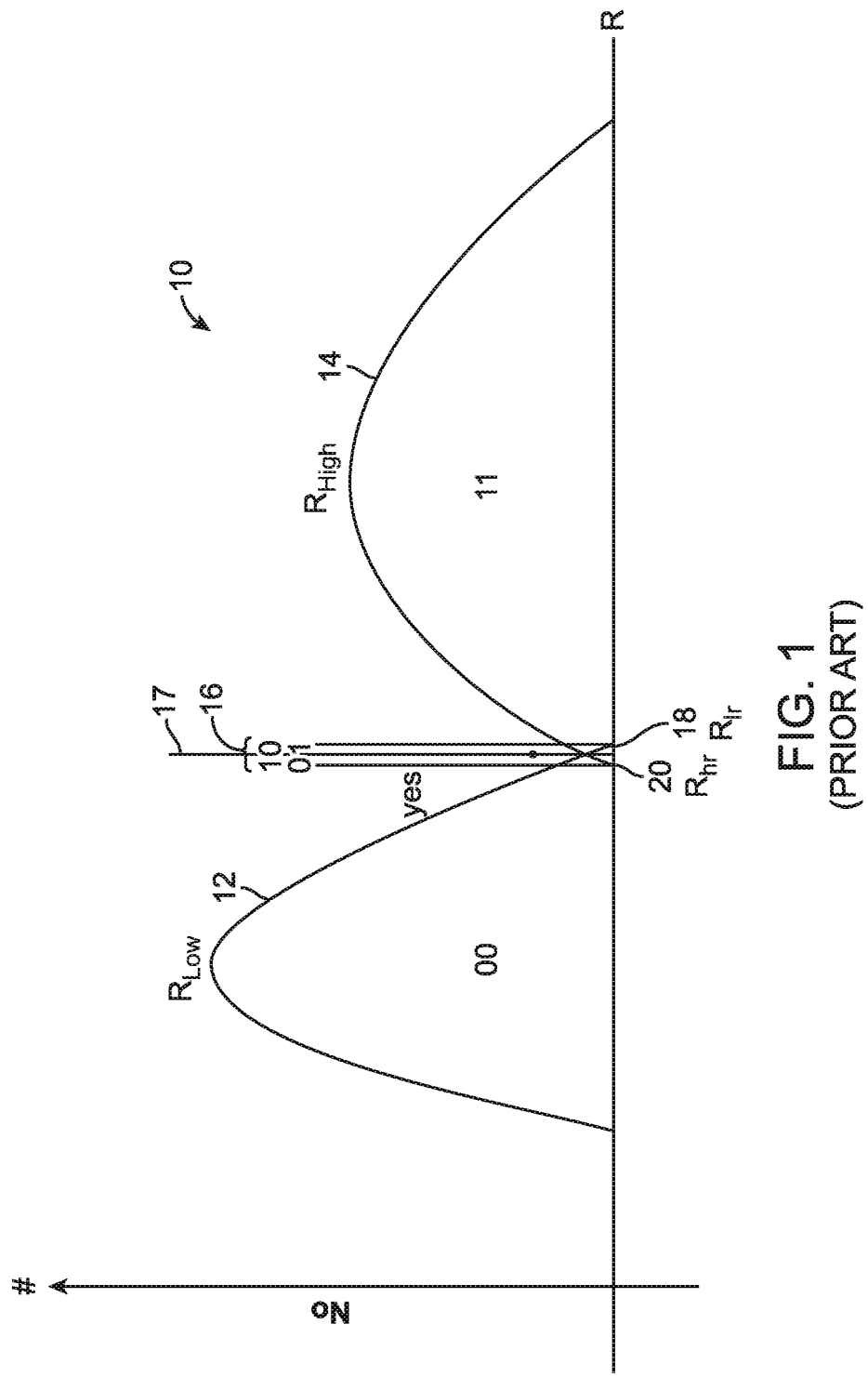
FIG. 1 shows a graph 10 of the Gaussian distribution of Rlow and Rhigh, in accordance with prior art techniques.

In operation, during manufacturing and testing of the circuit 200, two reference points, such as Rhr 20 and Rlr 18 shown in FIG. 1, are established at the initial test of the die. Rlr and Rhr are defined as follows:

Rlr; When all the MTJs of a magnetic memory array are programmed to their Rlow state, the resistance of at least approximately 99.3% of them is less than Rlr (the highest 3 sigma in Rlow distribution).

Rhr; When all the MTJs in the magnetic memory array are programmed to their Rhigh state, the resistance of at least approximately 99.3% of them is greater than Rhr (the lowest 3 sigma in Rhigh distribution).

Therefore, in a memory chip including a magnetic memory array, when the MTJs of the memory array are programmed to be Rhigh, using Rhr as reference resistor yields approximately 1 for 99.3% of the MTJs, and if they are all programmed to Rlow, using Rlr as the reference, the result yields approximately 0 for 99.3% of the MTJs.

Still referring to FIG. 2, current, generated by the current source 210 is applied and flows through the MTJ 202. The access transistor 204 selects the MTJ 202 for programming or reading using the voltage applied to its gate and drain, as discussed above. The sense amplifier 206 uses the reference resistance, i.e. Rlr 214, to sense the resistance value of the MTJ 202 and the sense amplifier 208 uses another reference, i.e. Rhr 212, to sense the resistance value of the MTJ 202. Each of the sense amplifiers 206 and 208 output a value, for example, the sense amplifier 206 generates the output 216 and the sense amplifier 208 generates the output 218.

As previously noted, the MTJ 202 is typically a part of a large magnetic memory array that has a multitude of MTJs included in a multitude of circuits, such as the circuit 200. Furthermore, data is typically read and written in chunks or blocks. In a typical application, data may be read or written 64 bits at a given time. In a single level application, there would be 64 circuits, each being analogous to the circuit 200. In a multi-level application, there may be fewer than 64 MTJs. During a read operation, as discussed above, a select bit is read while reading the 64-bit chunk of data. Based on the value of the select bit, either the output 216 is used or the output 218 is used as the reference for reading the 64 bits of data. It is noted that 64 bits is a design choice and other number of bits may be employed as a chunk to be read and written. The number of bits in a chunk or group of data may also, more or less, depend on how much correction is needed.

In summary, during a read operation, all the 65 bits (64 bits plus the select bit) are read with respect to Rhr and Rlr references. The result is two sets of 65 bits of data, an example of which is shown in Table 1.

FIG. 8 shows Table 1, which is an example of the state of two flag bits, in accordance with an embodiment of the invention. Table 1 shows which reference should be used for read depending on the flag bit. In an exemplary embodiment, if the select bit is 1, the data read with Rhr is correct, and if the select bit is 0, data with Rlr is correct. If the result of the select bits read with the two references are 1 and 0 (according to Table 1) then either references can be used. For instance, in Table 1, 1 and 1 indicates that data read with Rlr is incorrect. 01 indicates that both of them are incorrect, therefore reliable data cannot be retrieved. In the case of 00, the Rlr should be used to retrieve the MTJ data.

Figure 3:
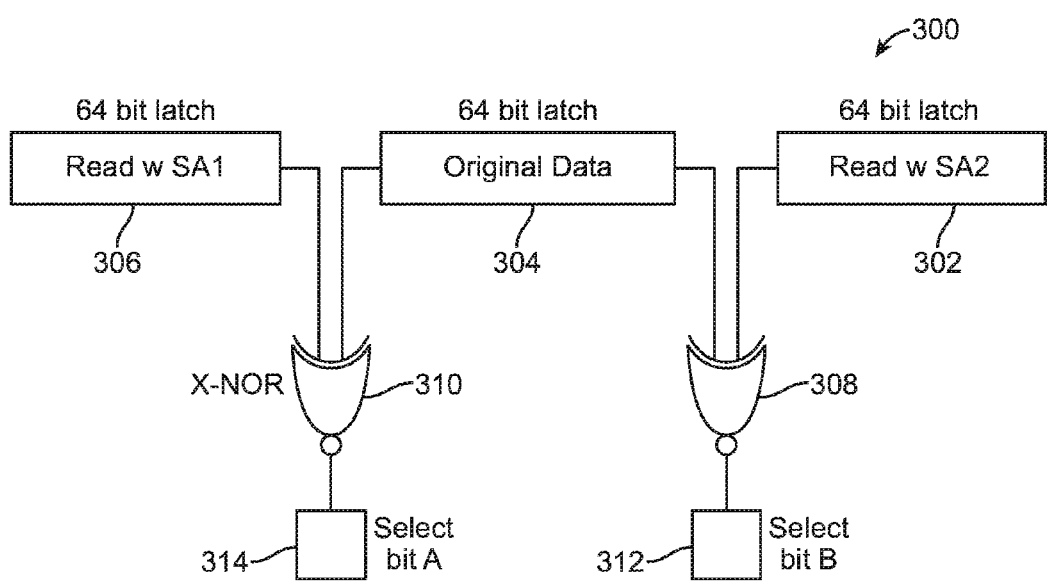
FIG. 3 shows the relevant circuitry for reading data from a magnetic memory array, in accordance with an embodiment of the invention.

FIG. 3 shows the relevant circuitry for writing data to a magnetic memory array, in accordance with an embodiment of the invention. This circuitry 300 of FIG. 3 presumes that a 64-bit chunk of data is written at a given time. It is understood that the circuitry 300 and the circuit 200 generally reside on the same die or chip and are used in conjunction with each other to read and write data.

The circuitry 300 is shown to include data latch 306 for sense amplifier SA1, an original data latch 304, data latch 302 for sense amplifier SA2, comparators 310 and 308, and select bits 314 and 312. Each of the latches 306, 304, and 302 is 64 bits in that it holds a 64-bit chunk of data, as discussed in the example provided above. The output of the latches 306 and 304 are coupled as inputs to the comparator 310. Similarly, the outputs of the latches 304 and 302 are shown as inputs to the comparator 308. The comparator 310 compares the outputs of the latches 306 and 304 are generates the result of the comparison as the select bit 314. Similarly, the comparator 302 compares the outputs of the latches 304 and 302 and generates the result of the comparison as the select bit 312.

In an embodiment of the invention, the comparators 310 and 308 are each implemented by using exclusive NOR (XNOR) gates, however, other implementations of these comparators is contemplated.

Each of the latches 306 and 302 include sense amplifiers such as the sense amplifiers 206 and 208 of FIG. 2. It is understood however, that for a 64-bit chunk of data, 128 sense amplifiers are employed. It is also understood that the term "latch" references a storage element, such as but not limited to a register, flip flop, or any other storage element suitable for saving data.

To further relate the FIGS. 2 and 3, the output 216 of the sense amplifier 206 is one of the inputs of the latch 306 of FIG. 3 and the output 218 of the sense amplifier 208 is one of the inputs of the latch 302 of FIG. 3.

During a write operation, 64 bits of data is loaded into a register or the latch 304. The loaded data is then written to the addressed location, the location that is intended for the data to be written. Next, the written data is read back employing the sense amps 216 and 218 and latches 306 and 302 and compared using the comparators 310 and 308, respectively, to the original data using two references, Rlr and Rhr, such as the Rlr 214 and the Rhr 212. If all the 64 MTJ resistances fall to the right side of the Rlr relative to the graph 10 of FIG. 1, or to the left of the Rhr (i.e. they are not in the overlap region of the distribution), then data is read with both Rlr and Rhr resembling the data in the latch 304. This means that the result of the comparators 310 and 308 of the read data with both Rlr and Rhr with the original data, i.e. the output of the latch 304 results in logical state "1".

In the case where one of the bits falls in the overlap region, i.e. at 16 in FIG. 1, there are two possibilities for this bit, as follows:

1—The bit meant to be 1 but Rhigh value is less than Rlr (perhaps TMR is low).
2—The bit meant to be 0 but Rlow value is more than Rhr (perhaps Rlow is high, this could happen if the MTJ size becomes too small).

In case 1—above, when the bad bit is read with Rhr, in fact the data is correct because the resistance of the bad bit is higher than Rhr, but when it is read with Rlr, the data read is incorrect indicating that the bit is part of an un-programmed MTJ distribution.

In case 2—above, when the bad bit is read using Rlr, the data is correct because the resistance of the bad bit is less than Rlr, but when it is read using Rhr, the data is incorrect, indicating that the bit is part of a programmed MTJ distribution.

In case 1—above, the result of the comparison (the original data in the register versus the read data) is "1" using Rhr as reference and "0" when Rlr is used as reference. In case 2—above, the opposite occurs. The comparison results is "0" when Rhr is used and "1" when Rlr is used. This means that the comparator results indicate which reference (Rhr, or Rlr) should be used for reading the data back. To utilize this, the result of the comparison is stored right along the original data, making the data chunks 65 bits long instead of 64 bits long.

In summary during the write operation of a 64-bit chunk of data, the following occurs:

1—The original data is loaded in the latch 304.
2—The content of the latch 304 is written into the intended destination of the magnetic memory array.
3—The written data is read back from the magnetic memory array using Rhr and Rlr references (stored in the latches 302 and 306), and the each is compared to the data that is read back using the comparators 310 and 308.
4—If the result of the comparison with Rhr is "1", the logical state "1" is assigned to the select bit. If the result of the comparison with Rlr is "1", the logical state "0" is assigned to the select bit.
5—Logical state "1" or logical state "0" is written depending on the result of 4—above, with the 64 bit. Therefore write operation consist of two writes and two reads.

The circuit 200 and the circuitry 300 are particularly useful in cases where the distributions of Rlow and Rhigh overlap or are intolerably close.

Figure 4:
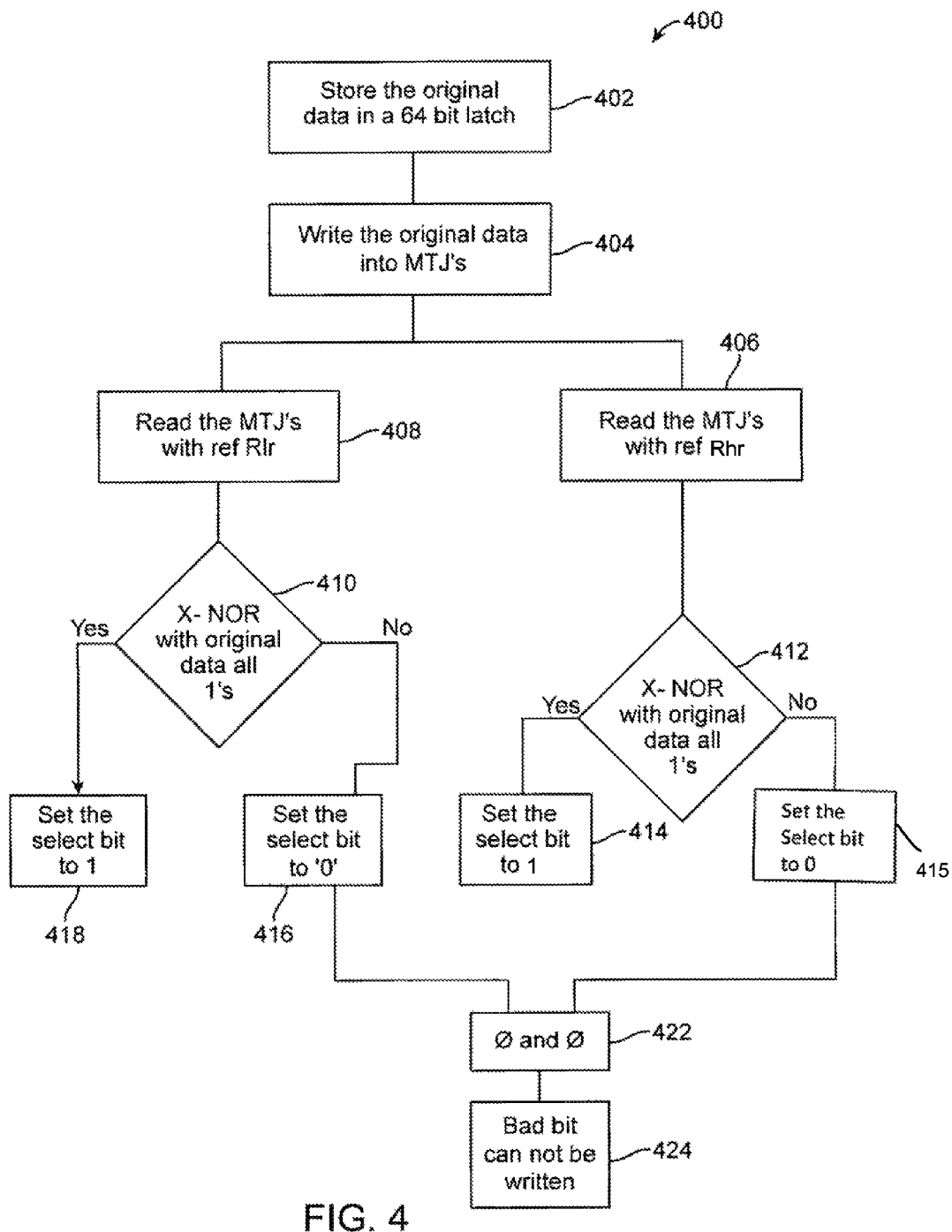
FIG. 4 shows a flow chart of the relevant steps performed in writing data, in accordance with a method of the invention.

FIG. 4 shows a flow chart 400 of the relevant steps performed in writing data, in accordance with a method of the invention. At 402, the original data (to be written) is stored in, for example, the latch 304 of FIG. 3. Next, at step 404, the stored original data is written into the MTJs which are intended to be the destinations of the write operation. Next, the data of the MTJs to which the original data is written at step 404 are read back using the reference resistance Rhr and at the same time, at step 406, the data of the MTJs to which the original data is written at step 404 are read back using the reference resistance Rlr. It is noted that reference resistances or reference resistance values are associated with reference MTJs, as is readily known in the art.

After step 408, the original data that is stored in the latch 304 is compared to all the written data using the comparator 308. For example, in the example using 64-bit data chunks, all 64 bits are compared to retrieved data from the memory. If the comparison yields a match, the select bit or the 65$^{th}$ bit is set to logical state "1" and if no match is detected at 410, the process continues to the step 416. At step 416, the select bit is set to logical state "0" and the process continues to step 422.

At 412, the original data, from the latch 304, is compared to all the written data using the comparator 310 in FIG. 3, and if a match is detected, the process continues to step 414 where the select bit is set to logical state "0", otherwise, the process continues to step 422. At step 422, both comparisons have yielded no match, therefore, the data that is in latch 304 is declared bad and is therefore not written to the magnetic memory array.

Figure 5:
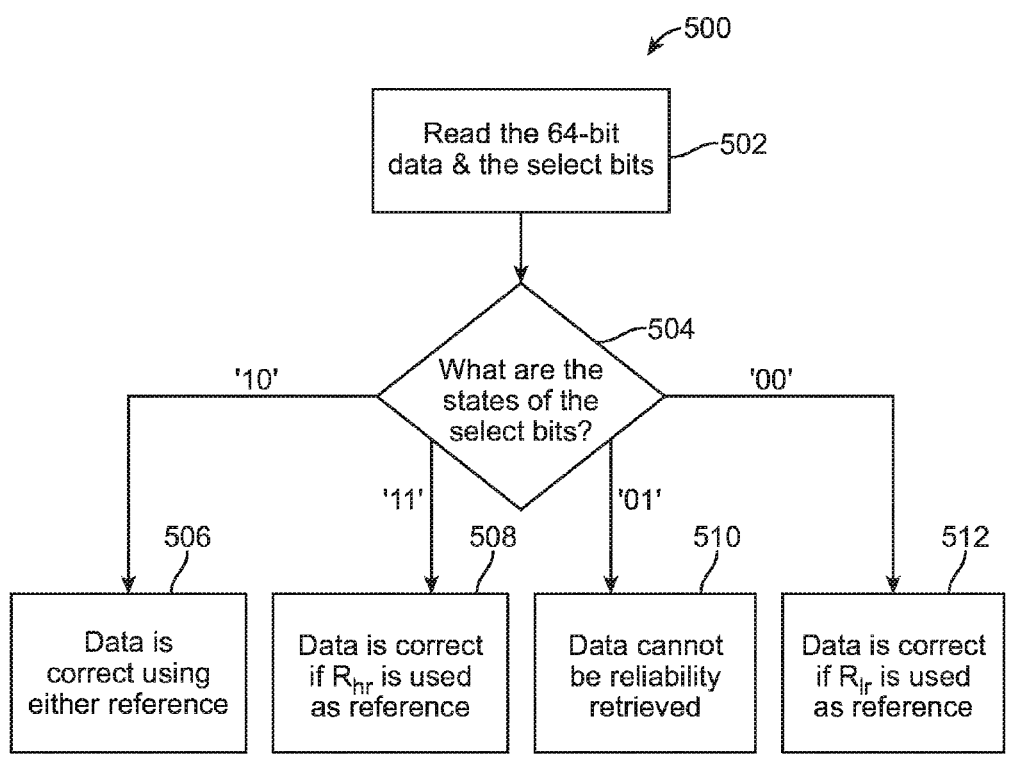
FIG. 5 shows a flow chart 500 of the relevant steps for reading data, in accordance with a method of the invention.

FIG. 5 shows a flow chart 500 of the relevant steps for reading data, in accordance with a method of the invention. At step 502, using the above example, a 64-bit data is read from the MTJs with respect to two references, this generates two select bits. Next, at 504, the select bits are identified as being logical states "10", "11", "01", or "00". If the logical state is determined to be "10", the process goes to step 506 indicating that the data is good regardless of reference, if the logical state is determined to be "11", the process goes to step 508 indicating that the data is good only with the use of reference Rhr, if the logical state is determined to be "01", the process continues to step 510 indicating that the data cannot be retrieved, and if the logical state is determined to be "00", the process goes to step 512 indicating that the data is good using reference Rlr.

At step 506, data can be read using either reference, Rhr or Rlr. At step 508 however, data is correct only if read using the reference Rhr. At step 510, data cannot be reliably read and at step 512, data is correct only if read using the reference Rlr.

In another embodiment of the invention, two additional sense amplifiers are used in addition to the ones used for the number of bits of data. For example, in the case of a 64-bit data, 130 sense amplifiers instead of 128 are employed in an effort to gauge the read select bit in case its resistance falls in or close to an overlap area.

As discussed before in MRAMs the magnetic junctions are defined to be zero or one, by the value of their resistances. The data of the MTJ is considered to be a logical value '0' when the resistance of the MTJ is low. This is when the orientations of the two magnetic layers of the MTJ are the same. When the two magnetic layers are in opposite directions the MTJ resistance is high and this is considered to be 1. Since the resistance of the MTJ is inversely proportional to the MTJ area, in a large memory, the MTJ resistance varies across the die and follows a Gaussian distribution. In a large memory the low resistance values of the MTJ has an average value (Rlavg) with variations specified with Srl. The programmed MTJs have higher value of average R (Rhavg), and also higher sigma (Srh). To read the MTJs and extract the data, one can compare the resistance value of the MTJ to a reference MTJ that has the resistance value of:

$$Rref=(Rl3sig+Rh3sig)/2 \qquad (2)$$

Where Rl3sig is the resistance value of the Rlow, 3 sigma higher than the Rlavg and Rh3sig is the resistance value of the Rhigh 3 sigma lower than the Rhavg. These are shown in FIG. 1 as Rlr and Rhr and Rref. The choice of 3 sigma is optional, for example a sigma of 5 or higher may be used.

The MTJs with higher resistances than this Rref, are considered to have data of 1 and the ones with lower R less than Rref are considered to have data of 0.

If the two distributions are sufficiently apart, one reference is sufficient for sensing and determining the MTJ resistance values, but the sensing becomes difficult when the Rlow and Rhigh distributions get too close or overlap.

In an exemplary method of the invention, a sensing technique is used for MRAMs that reduces errors in the case where the distributions of Rlow and Rhigh overlap. This method effectively reduces read errors in MRAMs with overlapping Rlow and Rhigh distributions.

In this exemplary method, the data is programmed and read in, for example, groups of 64 bits. It is noted that other sizes of the group, such as 32, 16, 8 bits, or any other value, may be employed and 64 bits is used merely as an example. A flag bit is used to reduce error in a group of 64 bits of data. The smaller the size of the data chunk the more flag bits are required for the memory chip. In this case during write 64 bits of data is loaded into a register. This data is then written to the addressed location, and then is read back and compared to the original data using this time only a single reference Rref as the reference. If all the MTJ resistances fall to the right side of Rlr, or to the left of the Rhr (i.e. they are not in the overlap region of the distribution) then data read, should look exactly like what is in the register. Now let us consider the case that one of the bits falls in the overlap region. There are two possibilities for this bit.

1—The bit meant to be 1 but Rhigh value is less than Rlr therefore the read data appears as 0. (TMR is low, or due to large size of MTJ programming current was not sufficient).

2—The bit meant to be 0 but Rlow value is more than Rhr therefore the read data appears as 1 (Rlow is too high, this could happen if the MTJ size becomes too small).

If the size of the memory is M, and the number of bits in the overlap region is n, then the chance of having one bit out of 64 bits in the overlap region is: p=64*n/2M. As an example if n=2000, and M=64000000. Then p=0.001. This means there is 0.1% chance that one of the bits in our 64 bit chunk to be read erroneously. Now if we consider the inverse of the 64 bits (1 instead of 0, and 0 instead of 1). The chance of having another bit in that from the overlap region would be p^2. The reason for this is that the original bad or corrupt bit moves to a different part of the distributions, and having another bit in the 64-bit chunk from the overlap part of the distribution is very unlikely. This means in the above example, the chance of having a bit from the overlap part of the distribution in the reverse of the 64 bit chunk is: p=0.000001, or 0.0001%, highly unlikely.

Figure 6:
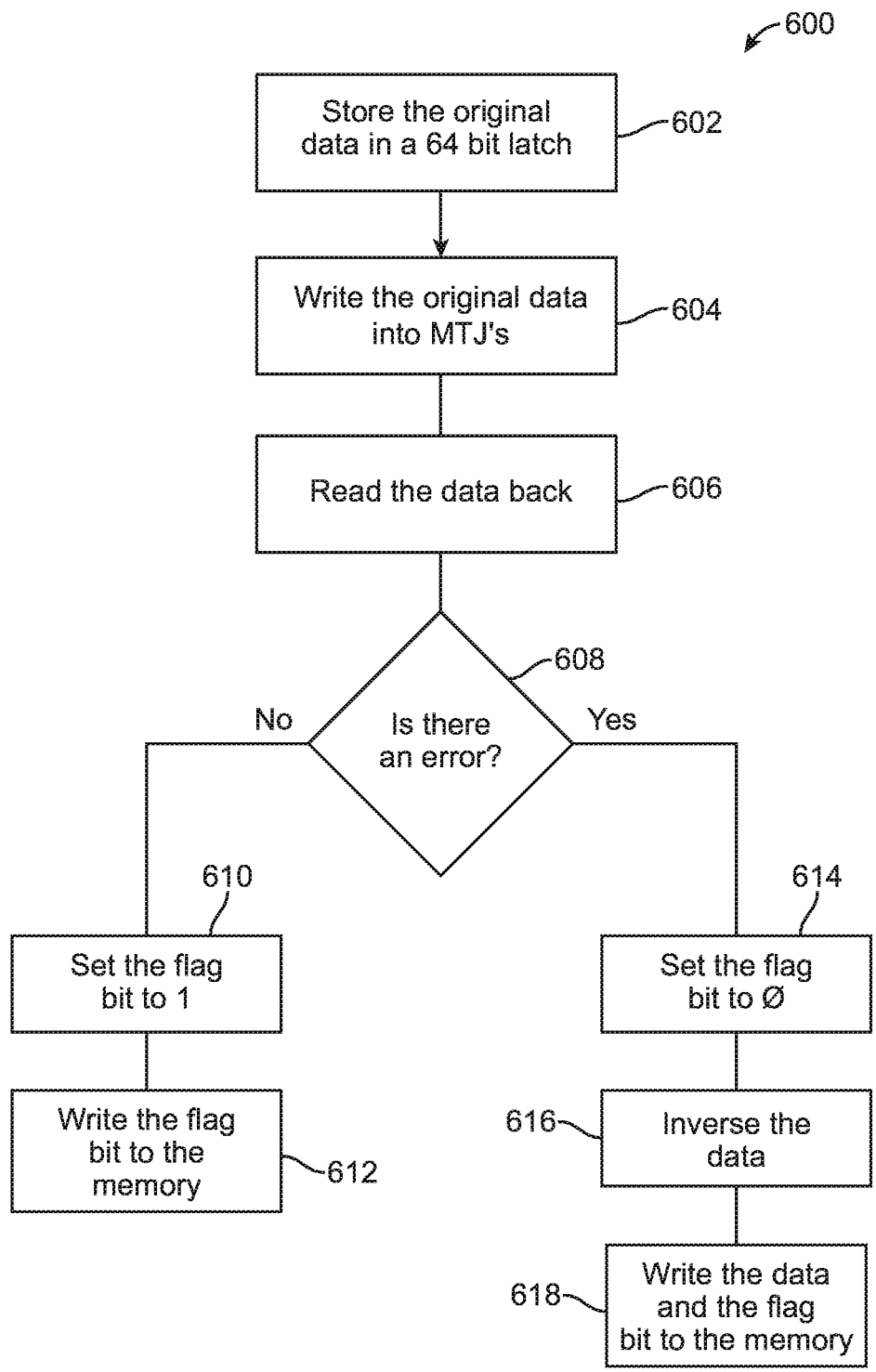
FIG. 6 shows a flow chart of the relevant steps for writing data, in accordance with another method of the invention.

FIG. 6 shows a flow chart 600 of the relevant steps for writing data, in accordance with another method of the invention. The write operation starts at 602 by storing the original 64-bit data or the data to be written in a register/latch to follow the example above. That is, to follow the example provided above where the data is 64 bits, 64 bits of data are saved in a register or a storage element. Next, at step 604, the original data of step 602 is written into MTJs. Additionally, along with the original data that is written at step 602, a flag bit is written for use in determining the integrity of the data being written and a later step. Next, at step 606, the data that is stored in the MTJs at step 604 is read back along with the associated flag bit, using the Rref reference. Next, at 608, a determination is made as to whether the data that is read has an error and if not, the process continues to step 610, otherwise, the process continues to step 614. Additionally, the read data is compared with the content of the register of step 604. At 610, if the data in the register is determined to be the same as the data that is read back from memory, i.e. the data has no errors, the flag bit is set accordingly to indicate no errors and the process continue to step 612 where the flag bit is saved in the memory. Otherwise the process continues to step 614. At step 614, the flag bit is set to "0". Additionally, at step 614, the flag bit is set to indicate an error in the data that has been read back from memory. Next, at step 616 the inverse of the data is generated and at step 618 written to memory along with the associated flag bit. Thus, in this case, the memory has an inverse version of the original data and the flag bit indicates as much. The reason that the data that has been read from memory at step 606 is inverted and then written back into memory at step 618 is because there is a great likelihood that there is no error in the data using its inverse.

Figure 7:
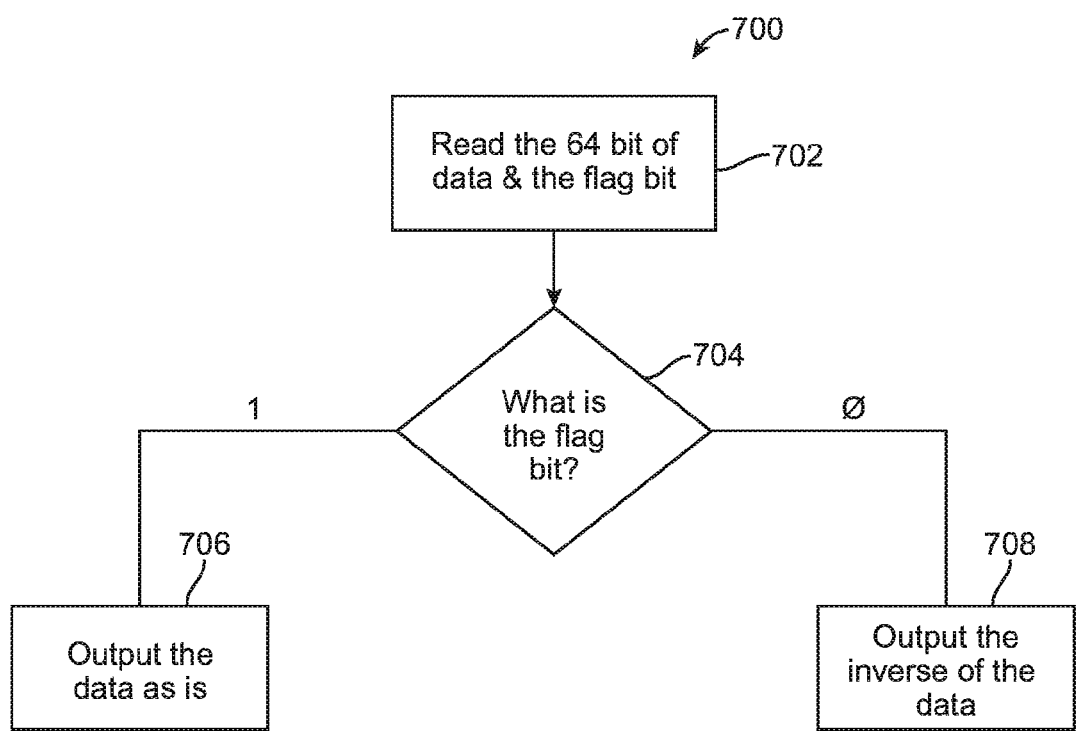
FIG. 7 shows a flow chart of the relevant steps for reading data, in accordance with a method of the invention.

FIG. 7 shows a flow chart 700 of the relevant steps for reading data, in accordance with a method of the invention. At step 702, the data is read from memory along with the data's associated flag bit. Next, at 704, the state of the flag bit is determined and if it is indicative of an inverse of the data, meaning the original data had an error, the process continues to step 708 where the inverse of the original data is output and used, otherwise, the process continues to step 706 where the original data is output and used.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of writing to a magneto tunnel junction (MTJ) comprising:
   writing data to the MTJ, the MTJ configured to store a bit of information representing two logical states;
   after the writing data step, first reading the written data using a first reference MTJ;
   after the writing data step, second reading the written data written using a second reference MTJ;
   first comparing the data read during the first reading step to a first predetermined value;
   second comparing the data read during the second reading step to a second predetermined value; and
   based on the result of the first and the second comparing steps, setting a select bit, the select bit being indicative of using the first reference MTJ or the second reference MTJ for subsequent writes to the MTJ.

2. The method of writing of claim 1, wherein the first reading step occurs at substantially the same time as the second reading step.

3. The method of writing of claim 1, wherein the first and second predetermined values are determined prior to the writing step.

4. The method of writing of claim 1, further including saving the select bit for subsequent write operations.

5. The method of writing of claim 1, wherein the first comparing step is performed after the first reading step and the second comparing step is performed after the second reading step.

6. The method of writing of claim 1, wherein the setting step includes setting more than one select bit.

7. The method of writing of claim 1, wherein the first comparing step includes checking for logical state of all '1's and based on the result of the first comparing step, setting the select bit to logical state '1' or logical state '0'.

8. The method of writing of claim 1, wherein the second comparing step includes checking for logical state of all '1's and based on the result of the second comparing step, setting the select bit to logical state '1' or logical state '0'.

9. The method of writing of claim 1, wherein the first comparing step includes checking for logical state of all '0's and based on the result of the first comparing step, setting the select bit to logical state '1' or logical state '0'.

10. The method of writing of claim 1, wherein the second comparing step includes checking for logical state of all '0's and based on the result of the second comparing step, setting the select bit to logical state '1' or logical state '0'.

11. The method of writing of claim 1, wherein the select bit is indicative of the state of the written data, after the written data has been read during the first and second reading steps.

12. The method of writing of claim 1, wherein the select bit is indicative of the state of the written data after the written data has been read during the first and second reading steps being corrupt or not.

13. The method of writing of claim 1, wherein the more than one bit is indicative of the state of data written to the MTJ after the written data has been read during the first and second reading steps, as being unreliable, reliable using either the first or the second reference MTJ for reading, reliable only when using one of the first or second reference MTJs for reading.

14. The method of writing of claim 1, wherein the MTJ is a multi-level MTJ configured to store more than one two logical states.

* * * * *